(12) United States Patent
Horiguchi et al.

(10) Patent No.: US 7,394,706 B2
(45) Date of Patent: Jul. 1, 2008

(54) SEMICONDUCTOR INTEGRATED CIRCUIT DEVICE

(75) Inventors: Masashi Horiguchi, Koganei (JP); Mitsuru Hiraki, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/717,080

(22) Filed: Mar. 13, 2007

(65) Prior Publication Data

US 2007/0183226 A1     Aug. 9, 2007

Related U.S. Application Data

(63) Continuation of application No. 11/156,648, filed on Jun. 21, 2005, now Pat. No. 7,200,054.

(30) Foreign Application Priority Data

Jul. 26, 2004 (JP) .............................. 2004-216662

(51) Int. Cl.
  *G11C 7/00* (2006.01)
(52) U.S. Cl. .................... 365/189.11; 365/189.09; 365/189.04
(58) Field of Classification Search ............ 365/189.11, 365/189.09, 189.04
  See application file for complete search history.

(56) References Cited

U.S. PATENT DOCUMENTS

| 7,200,054 B2 * | 4/2007 | Horiguchi et al. ...... 365/189.11 |
| 2003/0193349 A1 | 10/2003 | Shimizu et al. |
| 2004/0174148 A1 | 9/2004 | Hiraki et al. |

FOREIGN PATENT DOCUMENTS

| JP | 02-244488 | 9/1990 |
| JP | 2001-211640 | 8/2001 |

* cited by examiner

*Primary Examiner*—Thong Q Le
(74) *Attorney, Agent, or Firm*—Antonelli, Terry, Stout & Kraus, LLP.

(57) ABSTRACT

A semiconductor integrated circuit device with reduced consumption current is provided. A first step-down circuit stationarily forms internal voltage lower than supply voltage supplied through an external terminal. A second step-down circuit is switched between first mode and second mode according to control signals. In first mode, the internal voltage is formed from the supply voltage supplied through the external terminal and is outputted through a second output terminal. In second mode, operating current for a control system that forms the internal voltage is interrupted and an output high impedance state is established. The first output terminal of the first step-down circuit and the second output terminal of the second step-down circuit are connected in common, and the internal voltage is supplied to internal circuits.

6 Claims, 16 Drawing Sheets

FIG. 10

| STATE | REFERENCE VOLTAGE GENERATION CIRCUIT 10 | STEP-DOWN CIRCUIT FOR ANALOG | | STEP-DOWN CIRCUIT FOR DIGITAL | | |
|---|---|---|---|---|---|---|
| | | 20 | 21 | 30 | 31 | 32 |
| PROGRAM EXECUTION | OPERATE | OPERATE | OPERATE | OPERATE | OPERATE | OPERATE |
| SLEEP | OPERATE | OPERATE | OPERATE | OPERATE | OPERATE | STOP |
| SOFTWARE STANDBY | OPERATE | OPERATE | STOP | OPERATE | STOP | STOP |
| HARDWARE STANDBY | OPERATE | OPERATE | STOP | OPERATE | STOP | STOP |
| RESET | OPERATE | OPERATE | OPERATE | OPERATE | OPERATE | OPERATE |
| EXCEPTION HANDLING | OPERATE | OPERATE | OPERATE | OPERATE | OPERATE | OPERATE |

FIG. 18

| STATE | REFERENCE VOLTAGE GENERATION CIRCUIT 10 | STEP-DOWN CIRCUIT FOR ANALOG | | STEP-DOWN CIRCUIT FOR DIGITAL | | | |
|---|---|---|---|---|---|---|---|
| | | 20 | 21 | 33 | 34 | 35 | 36 |
| PROGRAM EXECUTION | OPERATE | OPERATE | OPERATE | OPERATE | OPERATE | OPERATE | OPERATE |
| SLEEP | OPERATE | OPERATE | OPERATE | OPERATE | STOP | OPERATE | STOP |
| SOFTWARE STANDBY | OPERATE | OPERATE | STOP | OPERATE | STOP | STOP | STOP |
| HARDWARE STANDBY | OPERATE | OPERATE | STOP | OPERATE | STOP | STOP | STOP |
| RESET | OPERATE | OPERATE | OPERATE | OPERATE | OPERATE | OPERATE | OPERATE |
| EXCEPTION HANDLING | OPERATE | OPERATE | OPERATE | OPERATE | OPERATE | OPERATE | OPERATE |

SEMICONDUCTOR INTEGRATED CIRCUIT DEVICE

CONTINUING DATA INFORMATION

The present application is a Continuation application of U.S. application Ser. No. 11/156,648, filed Jun. 21, 2005 now U.S. Pat. No. 7,200,054, the entire disclosure of which is hereby incorporated by reference.

FOREIGN PRIORITY DATA INFORMATION

The present application claims priority from Japanese patent application No. 2004-216662 filed on Jul. 26, 2004, the content of which is hereby incorporated by reference into this application.

BACKGROUND OF THE INVENTION

The present invention relates to a semiconductor integrated circuit device, and more particularly to a technology effectively used for semiconductor integrated circuit devices such as one-chip microcomputers and system LSIs that include a plurality of functional blocks and are provided with step-down power supply circuits for lowering the voltage of external power.

Some large-scale integrated circuits are provided with two step-down circuits for operation and for standby and so constructed that during standby, the step-down circuit for operation is stopped to reduce power consumption during standby. An example of such large-scale integrated circuits is disclosed in Japanese Unexamined Patent Publication No. Hei 2(1990)-244488. Some semiconductor integrated circuit devices selectively use two different types of step-down circuits (series type and switching type) depending on the operation mode for the enhancement of power efficiency. An example of such semiconductor integrated circuit devices is disclosed in Japanese Unexamined Patent Publication No. 2001-211640.

[Patent Document 1] Japanese Unexamined Patent Publication No. Hei 2(1990)-244488

[Patent Document 2] Japanese Unexamined Patent Publication No. 2001-211640

SUMMARY OF THE INVENTION

With respect to recent system LSIs such as one-chip microcomputers, there is a tendency to lower the threshold voltage of MOSFET (insulated gate field effect transistor) with decrease in operating voltage. However, this poses a problem. When the threshold voltage is lowered, leakage current due to subthreshold characteristic is increased. The simplest and most effective measure to cope with this is to partially turn off power supply to the circuitry during standby. However, the technique disclosed in Patent Document 1 is for memory and does not support the operation mode of microcomputers or the like. Neither Patent Document 1 or 2 takes into account cases where during standby, a step-down circuit is completely stopped to cut the internal supply voltage (the output of the step-down circuit). Consequently, a step-down circuit that can cope with turn-off of internal power supply was considered. As a result, the present invention was made.

An object of the present invention is to provide a semiconductor integrated circuit device with reduced consumption current. The above and other related objects and novel features of the present invention will be apparent from the description in this application and the accompanying drawings.

The following is a brief description of the gist of the representative elements of the invention laid open in this application. A first step-down circuit stationarily forms internal supply voltage as second reference potential smaller than supply voltage as first reference potential supplied through an external terminal. A second step-down circuit is switched between first mode and second mode according to control signals. In first mode, the internal supply voltage is formed from the supply voltage supplied through the external terminal and is outputted through a second output terminal. In second mode, operating current for a control system that forms the internal supply voltage is interrupted and an output high impedance state is established. The first output terminal of the first step-down circuit and the second output terminal of the second step-down circuit are connected in common, and the internal supply voltage is supplied to internal circuits.

The present invention allows power consumption to be significantly reduced in standby mode and in sleep mode.

BRIEF DESCRIPTION OF THE DRAWINGS

FIG. 10 is a drawing illustrating the operating state of the step-down circuits corresponding to the operating state of the microcomputer in FIG. 1.

FIG. 18 is a drawing illustrating the operating state of the step-down circuits corresponding to the operating state of the microcomputer in FIG. 15.

DETAILED DESCRIPTION OF THE PREFERRED EMBODIMENTS

Figure 1:
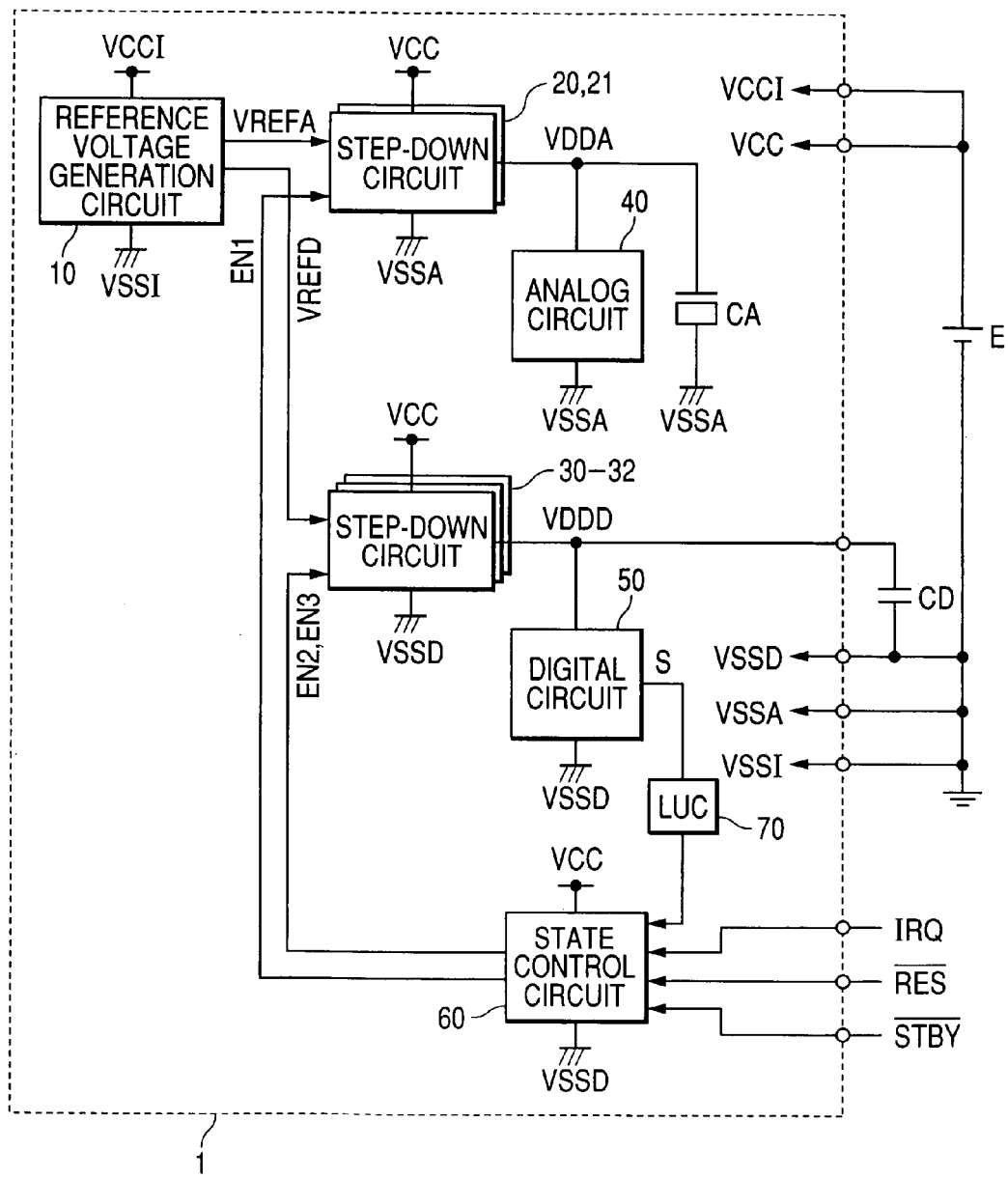
FIG. 1 is a block diagram illustrating an embodiment of a semiconductor integrated circuit device according to the present invention.

FIG. 1 is a block diagram illustrating an embodiment of a semiconductor integrated circuit device according to the present invention. The semiconductor integrated circuit device in this figure is directed to one-chip microcomputers or system LSIs including CPU. In this figure, numeral 1 denotes a semiconductor integrated circuit chip. Alphabetic code E denotes an external power supply that is at power supply potential as first reference potential, and its voltage value is set to, for example, 3.3V (Volt). The semiconductor integrated circuit chip 1 is provided with: two power supply terminals VCC and VCCI as external terminals that receive power supply potential supplied from the external power supply; and three grounding terminals VSSA, VSSD, and VSSI that are supplied with ground potential (fourth reference potential) such as 0V (Volt) of the circuitry. The power supply terminal VCCI and the grounding terminal VSSI are used as dedicated terminals that supply operating voltage VCCI and ground potential VSSI to the a reference voltage generation circuit 10. Of the remaining two grounding terminals, the grounding terminal VSSA is used to supply ground potential to step-down power supply circuits for analog circuit 20 and 21 and an analog circuit 40. The grounding terminal VSSD is used to supply ground potential to step-down power supply circuits for digital circuit 30 to 32, a digital circuit 50, and a state control circuit 60 described later. Also, a supply voltage terminal VCCQ and a grounding terminal VSSQ are provided for an input/output circuit though they are not shown in the figure.

Numeral 10 is a reference voltage generation circuit, and receives supply voltage VCCI and ground potential VSSI of the circuitry which are supplied through the external terminals, respectively. The reference voltage generation circuit 10 includes a constant-voltage generation circuit such as a publicly known band gap circuit (BGR). The reference voltage generation circuit 10 forms reference voltages VREFA and VREFD that are deemed to be substantially constant regardless of fluctuation in the external supply voltage VCCI or fluctuation in temperature. The voltage value of the reference voltage VREFA is set to, for example, 1.25V (Volt), and the voltage value of the reference voltage VREFD is set to, for example, 1.5V (Volt). In this embodiment, it is preferable that the independent power supply terminals VCCI and VSSI should be used, as illustrated in FIG. 1, for the suppression of power supply noise in the reference voltage generation circuit 10. If the power supply terminal VCCI is not provided, and power supply voltage VCC provided from power supply terminal VCC is unavoidably used as the power supply voltage of reference voltage generation circuit 10, it is preferable that power wiring should be separated from other circuits. More specific description will be given. Dedicated power wiring with which only the reference voltage generation circuit 10 is connected through an electrode pad corresponding to the power supply terminal VCC is provided.

Numerals 20 and 21 denote step-down power supply circuits for analog circuit. Receiving the reference voltage VREFA, the step-down power supply circuits for analog circuit 20 and 21 form internal voltage VDDA (second reference potential) for the analog circuit 40. The voltage value of the internal voltage VDDA is set to, for example, 2.5V (Volt). The step-down power supply circuits for analog circuit 20 and 21 operate on supply voltage VCC and ground potential VSSA of the circuitry which are supplied through the external terminals, respectively. Alphabetic code CA denotes a capacitive element for smoothing constructed on chip (hereafter, also referred to as "on-chip smoothing capacitance"). The capacitive element for smoothing CA is provided between the output terminal (VDDA) of the step-down power supply circuits for analog circuit 20 and 21 and ground potential VSSA of the circuitry.

Numerals 30 to 32 denote step-down power supply circuits for digital circuit. The step-down power supply circuits for digital circuit 30 to 32 receive the reference voltage VREFD and form internal voltage VDDD (third reference potential) for a digital circuit 50. The voltage value of the internal voltage VDDD is set to, for example, 1.5V (Volt). The step-down power supply circuits for digital circuit 30 to 32 operate on supply voltage VCC and ground potential VSSD of the circuitry which are supplied through the external terminals, respectively. Alphabetic code CD denotes an external capacitive element for smoothing (hereafter, referred to as "off-chip smoothing capacitance"). The capacitive element for smoothing CD is connected with the output terminal (VDDD) of the step-down power supply circuits for digital circuit 30 to 32 through an external terminal for connection.

Numeral 40 denotes an analog circuit, comprising, for example, a PLL (Phase Locked Loop) circuit, a DLL (Delay Locked Loop) circuit, an A-D converter, a D-A converter, and the like. The analog circuit 40 uses VDDA and VSSA as power supply. Numeral 50 denotes a digital circuit, comprising a logic circuit such as CPU, and memory circuits such as ROM (Read Only Memory) and RAM (Random Access Memory). The digital circuit 50 uses VDDD and VSSD as power supply. Numeral 60 denotes a state control circuit, and controls the operating state of the semiconductor integrated circuit 1 according to the output signal S of the digital circuit 50, and externally inputted interrupt request signals IRQ, reset signals /RES, and standby signals /STBY. The state control circuit 60 uses VCC and VSSD as power supply. Numeral 70 denotes a level-up conversion circuit, and converts the output signal S (VDDD level) of the digital circuit 50 into a VCC level corresponding to the operating voltage of the state control circuit 60.

The semiconductor integrated circuit device in this embodiment is provided with a plurality of the step-down power supply circuits 20 and 21 and 30 to 32 respectively for the analog circuit 40 and for the digital circuit 50. All or some of the step-down power supply circuits are turned off in correspondence with the operating states of the analog circuit 40 and the digital circuit 50 for the reduction of power consumption. This does not mean that only the operating voltages for the analog circuit 40 and the digital circuit 50 in non-operating state are interrupted. It means that corresponding operating currents that form the output voltages of the step-down power supply circuits 20, 21, and 30 to 32 are also interrupted.

The state control circuit 60 is operated on external power VCC, not on internal power supply. Thus, when the analog circuit or the digital circuit does not operate, the power supply capability of the corresponding step-down power supply circuits 20 and 21 or 30 to 32 is reduced for the reduction of power consumption. The step-down power supply circuits for analog circuit 20 and 21 use the on-chip smoothing capacitance CA, and the step-down power supply circuits for digital circuit 30 to 32 use the off-chip smoothing capacitance CD. The reason why an on-chip smoothing capacitance is used for the smoothing capacitance CA for analog circuit is that the frequency characteristic is enhanced. More specific description will be given. Use of an off-chip smoothing capacitance involves the parasitic inductance of bonding wires and a package; therefore, an on-chip smoothing capacitance can prevent its influence. The smoothing capacitance CD for digital circuit is required to withstand a peak current equal to or rather larger than the frequency characteristic. Therefore, an off-chip smoothing capacitance having a large capacitance value, for example, 0.1 µF to 1 µF, is used.

Figure 2:
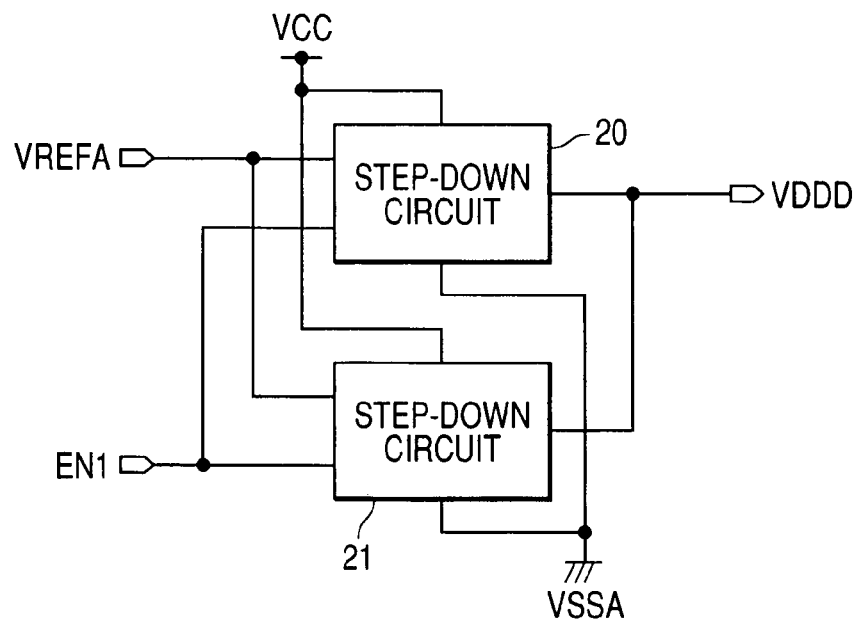
FIG. 2 is a block diagram illustrating an embodiment of the step-down power supply circuits for analog circuit in FIG. 1.

FIG. 2 is a block diagram illustrating an embodiment of the step-down power supply circuits for analog circuit in FIG. 1. Numeral 20 denotes a circuit block as a step-down circuit for standby, and its current supply capability is set low to reduce the power consumption. This step-down circuit 20 is normally operated. However, it is accelerated by input of an enable signal EN1. Numeral 21 denotes a circuit block as a step-down circuit for operation. Its current supply capability is set high to increase the power consumption. The step-down circuit 21 is activated by the enable signal EN1, and forms internal voltage VDDA with the high current supply capability. When the step-down circuit 21 is deactivated by the enable signal EN1, its own operating current is interrupted and its operation of outputting the internal voltage VDDA is stopped. Thus, the step-down circuit 21 is brought into output high impedance state. The output terminals of the step-down circuits 20 and 21 as two circuit blocks are connected with each other.

Figure 3:
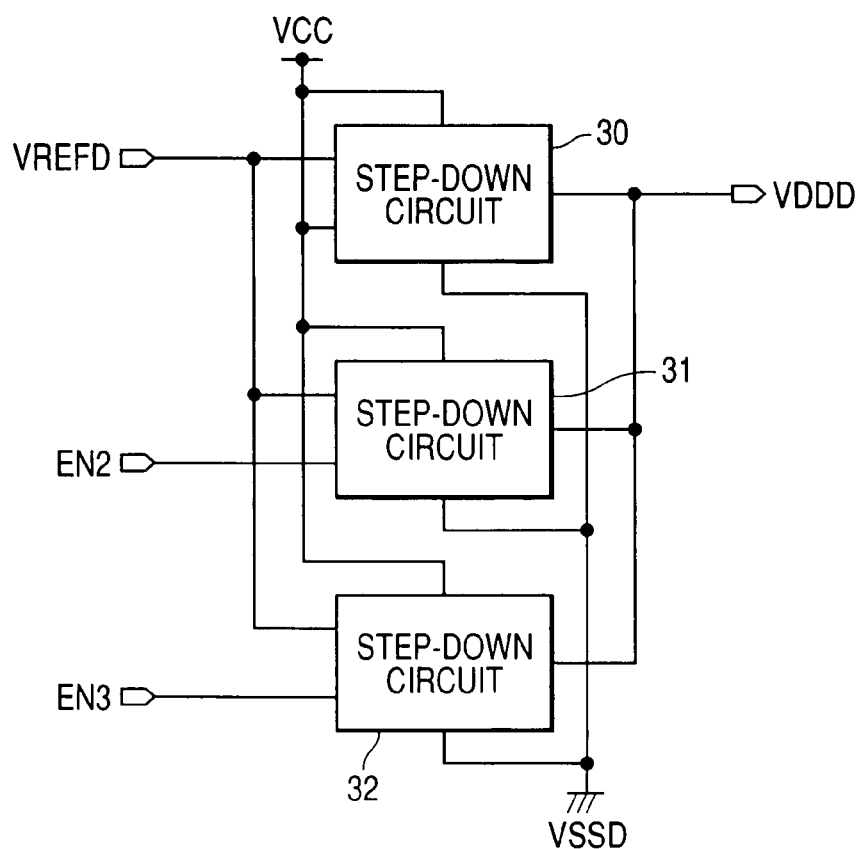
FIG. 3 is a block diagram illustrating an embodiment of the step-down power supply circuits for digital circuit in FIG. 1.

FIG. 3 is a block diagram illustrating an embodiment of the step-down power supply circuits for digital circuit in FIG. 1. Numeral 30 denotes a step-down circuit for standby, and its current supply capability is set low to reduce the power consumption. Since its input terminal for enable signal is connected with supply voltage VCC, the step-down circuit 30 is normally operated. The current supply capability of the step-down circuits 31 and 32 is set high to increase the power consumption. The step-down circuits 31 and 32 are respectively activated by enable signals EN2 and EN3, and form internal voltage VDDD with the high current supply capability. When the step-down circuits 31 and 32 are deactivated by the enable signal EN2 or EN3, their own operating current is interrupted, and their operation of outputting the internal voltage VDDD is stopped. Thus, the step-down circuits 31 and 32 are brought into output high impedance state. The output terminals of the step-down circuits 30 to 32 as three circuit blocks are connected with one another.

Figure 4:
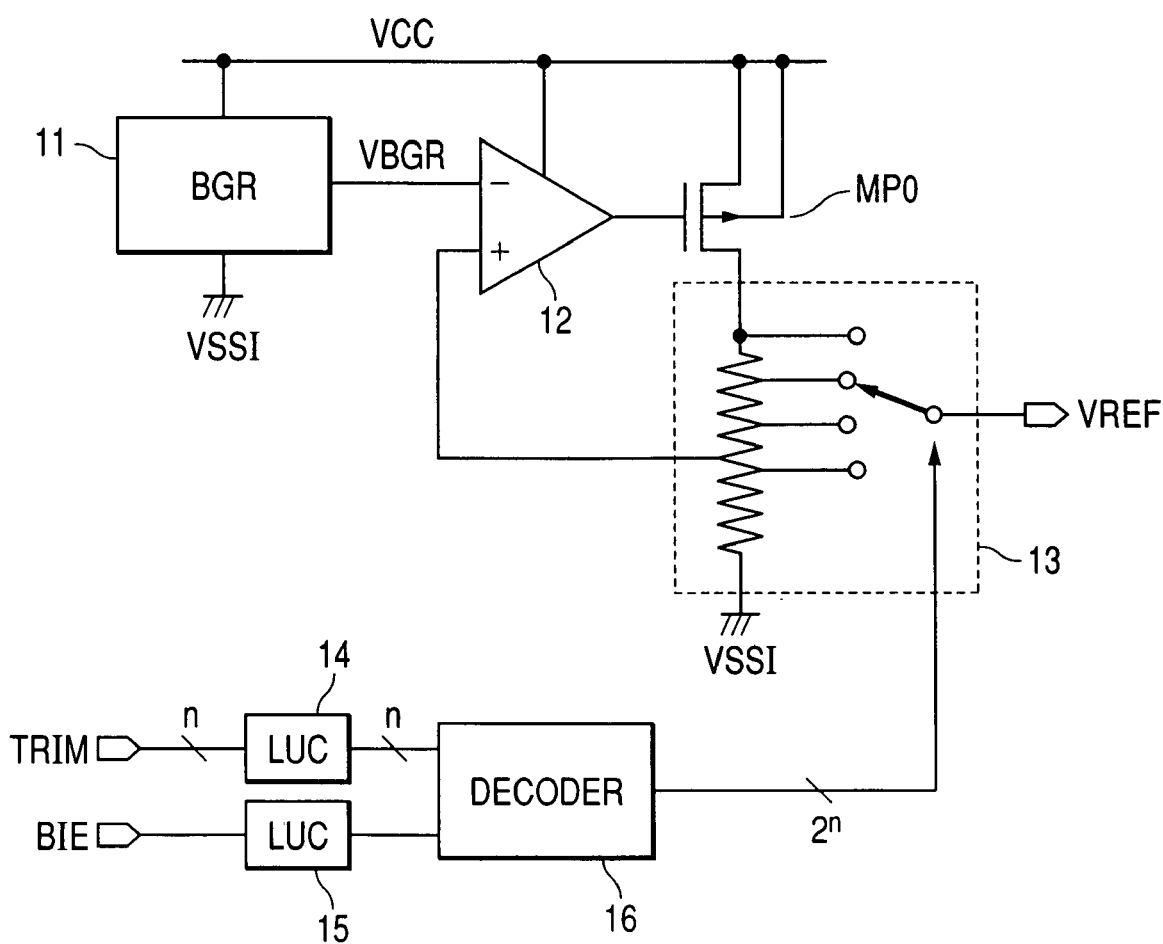
FIG. 4 is a block diagram illustrating an embodiment of the reference voltage generation circuit in FIG. 1.

FIG. 4 is a block diagram of an embodiment of the reference voltage generation circuit in FIG. 1. Numeral 11 denotes a silicon band gap circuit (BGR), and generates stable voltage VBGR independent of supply voltage VCC and temperature. Any other circuit may be used in place of the band gap circuit as long as it is capable of. generating stable voltage. For example, a circuit that takes out the difference in threshold voltage between MOSFETs may be used. In the figure, numeral 12 denotes a differential amplifier, which is supplied at the inverting input terminal (−) with reference voltage VBGR, and drives a p-channel output MOSFET MP0. The source and the substrate (back gate) of the MOSFET MP0 is connected with supply voltage VCC. The MOSFET MP0 is provided with a tapped resistor string 13 between its drain and ground potential VSSI of the circuitry. The divided voltage at a predetermined tap of the resistor string 13 is supplied to the non-inverting input terminal (+) of the amplifier 12. The divided voltage is controlled in negative feedback loop so that it agrees with the reference voltage VBGR.

The amplifier 12, tapped resistor string 13, and MOSFET MP0 constitute a trimming circuit. Output voltage VREF can be varied by changing the resistor tap of the tapped resistor string 13 at which voltage is taken out. Alphabetic code TRIM denotes a trimming signal, and its signal level is set to the level of supply voltage VDDD. Alphabetic code BIE denotes a burn-in enable signal, and its voltage level is set to the level of VDDD. The signals TRIM and BIE are outputted by the CPU, described later, in the digital circuit 50. Numerals 14 and 15 denote level-up conversion circuits, which convert input signals at the VDDD level into the VCC level.

Numeral 16 denotes a decoder, and its operating voltages are of VCC and VSSD. When the signal BIE is at low level (normal operation), the decoder decodes the TRIM signal to generate a resistor tap selection signal. When the BIE signal is at high level (burn-in), the decoder selects the tap in the highest position regardless of the TRM signal. Thus, the reference voltage VREF becomes higher than in normal operation (1.5V or 2.5V). When the microcomputer is in reset state (described later), the outputs of the level-up conversion circuits 14 and 15, that is, the converted signals TRIM and BIE are fixed at low level. It is advisable that the decoder 16 is so constructed that it selects a default value (e.g. the center tap of the resistor string) at this time.

In this embodiment, the level-up conversion circuits 14 and 15 are placed at the front of the decoder 16 (input side). Instead, they may be placed behind the decoder 16 (output side). In this case, VDDD and VSSD are used for the operating voltage of the decoder 16. However, it is preferable that they should be placed at the front of the decoder 16 (input side) because the number of the level-up conversion circuits 14 and 15 can be reduced. More specific description will be given. When the signal TRIM is of n bits, the number of the level-up conversion circuits 14 required is n. If the level-up conversion circuits are placed behind the decoder 16, however, more, specifically $2^n$, level-up conversion circuits are required.

Figure 5:
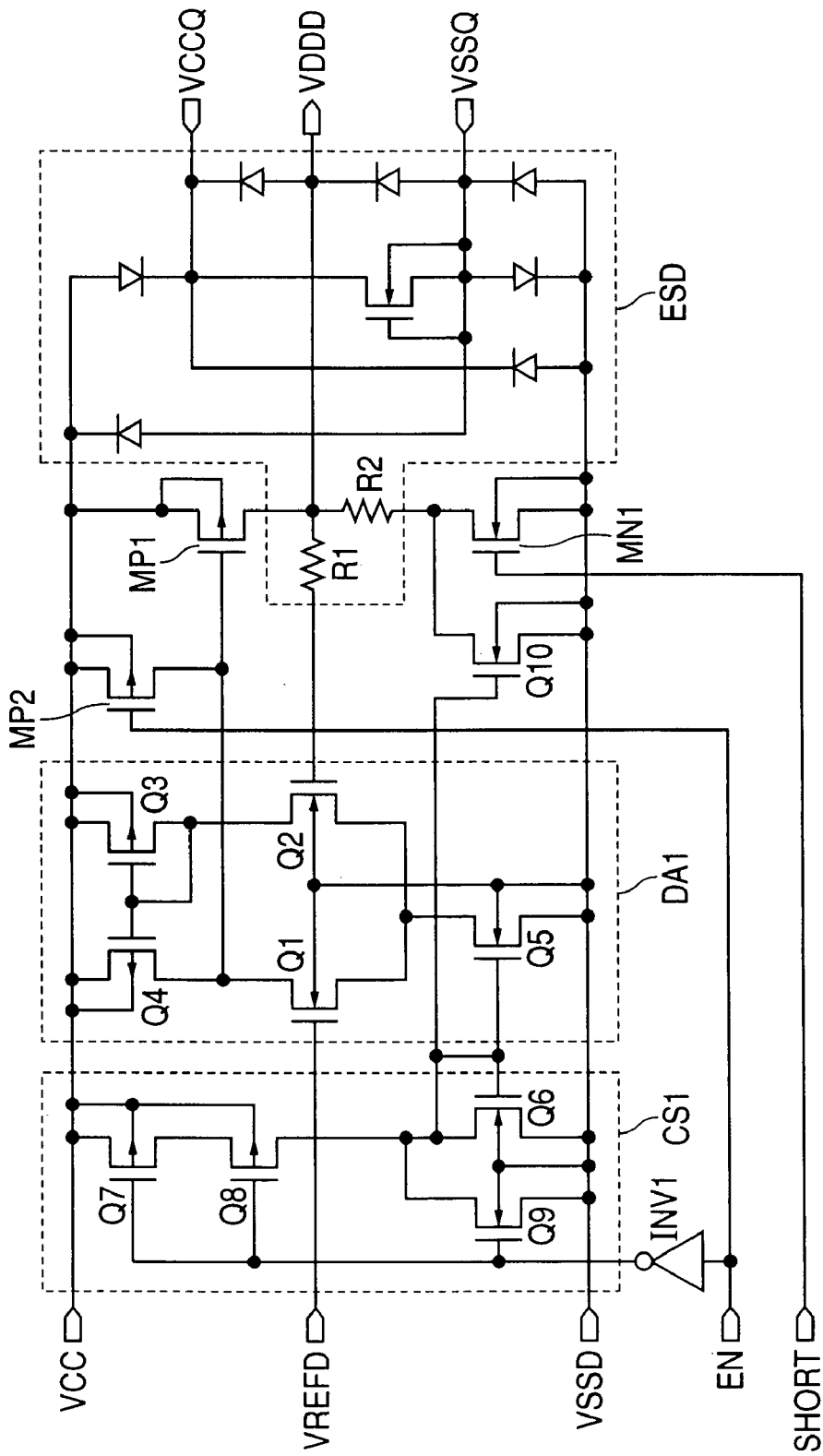
FIG. 5 is a circuit diagram illustrating an embodiment of the step-down circuits 31 and 32 in FIG. 3.

FIG. 5 is a circuit diagram of an embodiment of the step-down circuits 31 and 32 in FIG. 3. Alphabetic code VREFD denotes reference voltage. Alphabetic code EN denotes an enable signal, which is provided with the amplitude between VCC and VSS with respect to its signal level. When the enable signal is at high level (VCC), the step-down circuits are activated. Alphabetic code SHORT denotes a short circuit signal, which is provided with the amplitude between VCC and VSS with respect to its signal level. When the short circuit signal is at high level (VCC), MOSFET MN1 is turned on. This signal SHORT is used to zero internal power supply VDDD when the step-down circuits are deactivated by the enable signal EN being at low level. The signal SHORT is not used in the embodiment illustrated in FIG. 1 or FIG. 3 (kept at low level), but is used in the embodiment illustrated in FIG. 15, described later. Alphabetic code VCCQ denotes a power supply terminal for input/output circuit, and its voltage level is made identical with that of VCC. Alphabetic code VSSQ denotes a grounding terminal for input/output circuit.

Alphanumeric code CS1 denotes a current source, which comprises MOSFETs Q6 to Q9. When the enable signal EN is at high level, the n-channel MOSFET Q9 is turned off, and the p-channel MOSFETs Q7 and Q8 are turned on to pass current through the n-channel MOSFET Q6 in the form of diode. Thus, MOSFETs Q5 and Q10 configured in current mirror with respect to the MOSFET Q6 are caused to operate as a current source. When the enable signal EN is at low level, the n-channel MOSFET Q9 is turned on, and the p-channel MOSFETs Q7 and Q8 are turned off. Thus, the current is interrupted. At the same time, the gates and the sources of the MOSFETs Q6, Q5, and Q10 are short-circuited to each other by the MOSFET Q9 being in on state. Thus, they are turned off. As mentioned above, the operating current of a differential amplifier DA1 and an output circuit described next by the enable signal EN being at low level.

Alphanumeric code DA1 denotes a differential amplifier, which comprises: n-channel differential MOSFETs Q1 and Q2; the current source MOSFET Q5 provided between their sources and grounding terminal VSSD of the circuitry; and an active load circuit comprising p-channel MOSFETs Q3 and Q4 in current mirror configuration, provided between the drains of the MOSFETs Q1 and Q2 and power supply terminal VCC. Alphanumeric code MP1 denotes a p-channel output MOSFET. The p-channel output MOSFET MP1 is supplied at its gate with the output signal of the differential amplifier, and constitutes an output circuit together with the current source MOSFET Q10 provided on the drain side. Alphanumeric code MP2 denotes a p-channel MOSFET, and is provided between the gate and the source of the output MOSFET MP1. The MOSFET MP2 is supplied at its gate with the enable signal EN, and forcedly brings the output MOSFET MP1 into off state (output high impedance state) when the signal EN is at low level.

Alphanumeric code MN1 denotes an n-channel MOSFET, which is supplied at its gate with a signal SHORT, and short-circuits VDDD and VSSD when the signal SHORT is at high level. That is, when the signal SHORT is at high level, the n-channel MOSFET NM1 forcedly pulls VDDD out to the VSSD level. Alphanumeric code ESD denotes an electrostatic discharge damage protective element circuit, which comprises diodes, a protective MOSFET, and resistors R1 and R2. To externally install the smoothing capacitance CD, the VDDD terminal is constructed as an external terminal. Therefore, it is preferable that the ESD should be installed to take measures against electrostatic discharge damage.

Figure 6:
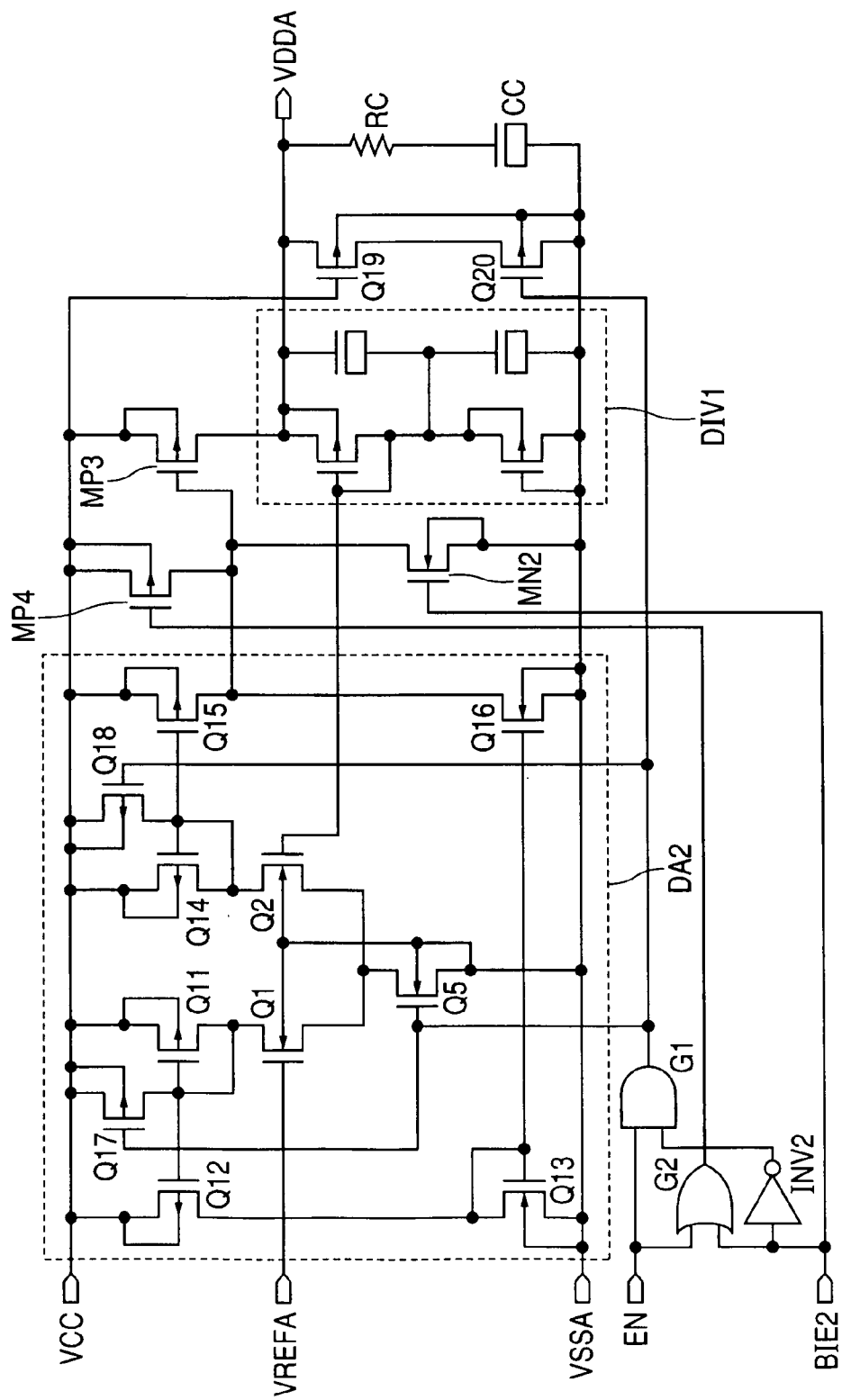
FIG. 6 is a circuit diagram illustrating an embodiment of the step-down circuit 21 in FIG. 2.

FIG. 6 is a circuit diagram of an embodiment of the step-down circuit 21 in FIG. 2. Alphabetic code VREFA denotes reference voltage. Alphabetic code EN denotes an enable signal, which is provided with the amplitude between VCC and VSS with respect to its signal level. When the enable signal is at high level (VCC), the step-down circuit is activated. Alphanumeric code BIE2 denotes a burn-in enable signal, and its signal level is set to VCC and VSSA. One of methods for carrying out burn-in is to increase the reference voltage described with reference to FIG. 4 higher than usual. Another method is to directly connect external power supply and internal power supply. That is, external power VCC is directly applied to internal circuits. When the signal BIE2 is brought to high level, an n-channel MOSFET MN2 is turned on, and the gate of a p-channel MOSFET MP3 is brought to low level. As a result, supply voltage VCC and output voltage VDDA are directly connected with each other. Alphabetic code EN denotes an enable signal, and its signal level is set to VCC and VSSA. When the enable signal is at high level (VCC), the step-down circuit is activated.

Alphanumeric code DA2 denotes a differential amplifier, which uses differential MOSFETs Q1 and Q2 and a current source MOSFET Q5 similarly with the foregoing. The drain current of the differential MOSFET Q1 is outputted through the following: a p-channel MOSFET Q11 in the form of diode; a p-channel MOSFET Q12 configured in current mirror with respect thereto; an n-channel MOSFET Q13 in the form of diode that receives the drain current of the p-channel MOSFET Q12; and an n-channel MOSFET Q16 configured in current mirror with respect thereto. The drain current of the differential MOSFET Q2 is outputted through a p-channel MOSFET Q14 in the form of diode and a p-channel MOSFET Q15 configured in current mirror with respect thereto. The difference between the drain current of the p-channel MOSFET Q15 and the drain current of the n-channel MOSFET Q16 drives the output MOSFET MP3. In this differential amplifier DA2, the output signal of an AND gate circuit G1 that receives the output signal of an inverter circuit INV2 that receives the signal EN and the signal BIE2 is transmitted to the gate of the MOSFET Q5. When the signal EN is at high level, the signal BIE2 is at low level, and burn-in state is not established, the step-down circuit is activated. When the signal EN is at low level or the signal BIE2 is at high level, amplification operation is stopped by the MOSFET Q5 being in off state. At the same time, p-channel MOSFETs Q17 and Q18 are turned on, and the operation of the current mirror circuit is also stopped.

Alphanumeric code DIV1 denotes a voltage divider circuit, which feeds voltage equivalent to ½ of output voltage VDDA back to the differential amplifier DA2. Thus, the output voltage VDDA becomes a voltage two times the reference voltage VREFA. Alphabetic codes RC and CC denote a resistor for phase compensation and a capacitance. Such a step-down circuit for digital as illustrated in FIG. 5 is externally connected with a large smoothing capacitance; therefore, the above-mentioned phase compensation is unnecessary. With respect to step-down circuits for analog, however, it is advisable that a phase compensation circuit is added for the prevention of oscillation.

Alphanumeric code MP3 denotes a p-channel output MOSFET, which is provided with the voltage divider circuit DIV1 as a load circuit. Alphanumeric code MP4 denotes a p-channel MOSFET. The p-channel MOSFET MP4 receives the output signal of an OR gate circuit G2 that receives the signal EN and the signal BIE2. When both the signal EN and the signal BIE2 are at low level (logic 0), the p-channel MOSFET MP4 is turned on, and brings the gate of the output MOSFET MP3 to high level and the output MOSFET MP3 into off state (output high impedance state). Alphanumeric code MN2 denotes an n-channel MOSFET. When the signal BIE2 is at high level, the n-channel MOSFET MN2 brings the gate of the output MOSFET MP3 to low level, and increases the output voltage VDDA as high as the supply voltage VCC.

Figure 7:
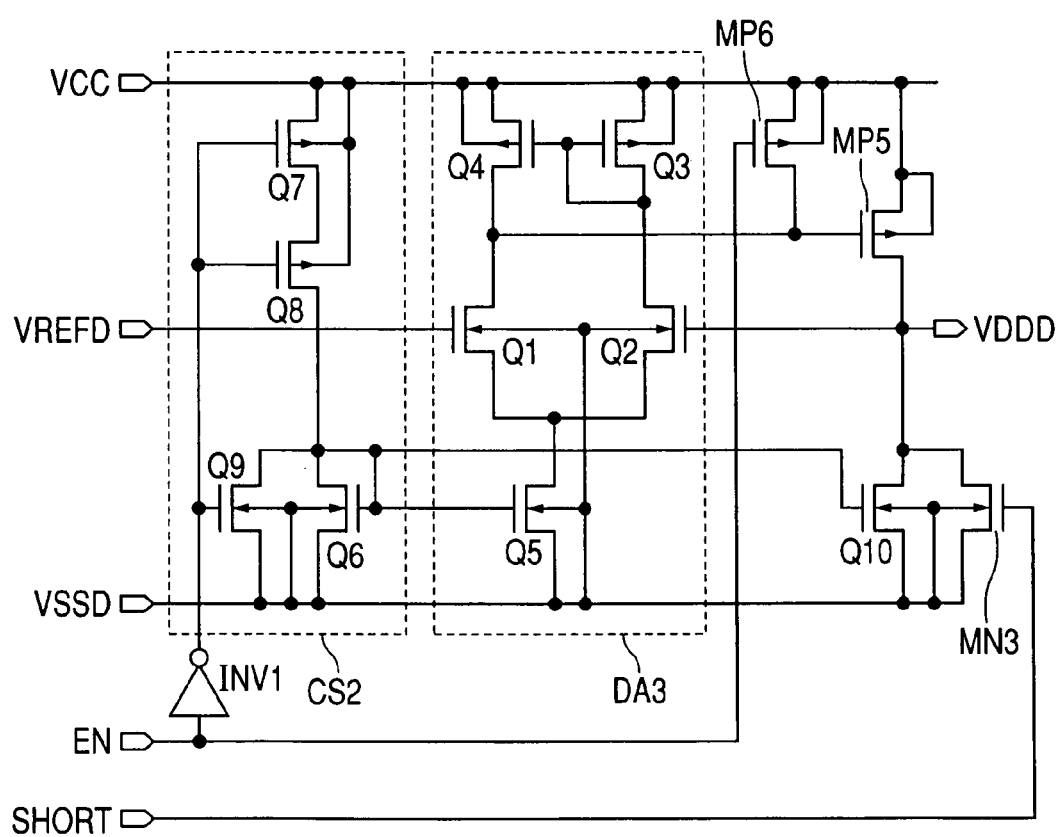
FIG. 7 is a circuit diagram illustrating an embodiment of the step-down circuit 30 in FIG. 3.

FIG. 7 is a circuit diagram of an embodiment of the step-down circuit 30 in FIG. 3. Alphabetic code VREFD denotes reference voltage. Alphabetic code EN denotes an enable signal, and its signal amplitude is set to between VCC and VSSD. When the signal EN is at high level, this circuitry is activated. The enable signal EN is not used in the embodiment illustrated in FIG. 1 (kept at high level), but is used in the embodiment illustrated in FIG. 13, described later. Alphabetic code SHORT denotes an output short circuit signal, and its signal amplitude is set to between VCC and VSSD. The output short circuit signal SHORT is used to zero the internal voltage VDDD. The output short circuit signal is not used in the embodiment illustrated in FIG. 1 (kept at low level), but is used in the embodiment illustrated in FIG. 15, described later.

Alphanumeric code CS2 denotes a current source. The current source CS2 is constituted of the same circuit elements Q6 to Q9 as in the current source CS1 illustrated in FIG. 5. However, the current source CS2 is so set that its current value is lower than that of the current source CS1. Alphanumeric code DA3 denotes a differential amplifier. The differential amplifier DA3 is constituted of the same circuit elements Q1 to Q5 as in FIG. 5. Alphanumeric code MP5 denotes a p-channel output MOSFET, and alphanumeric code MP6 denotes a p-channel MOSFET. When the signal EN is at low level, the p-channel MOSFET MP6 is turned on, and brings the gate of the output MOSFET MP5 to high level to bring the output MOSFET MP5 into off state. Thus, output high impedance state is established. Alphanumeric code MN3 denotes an n-channel MOSFET. When the signal SHORT is at high level, the MOSFET MN3 is turned on and short-circuits VDDD and VSSD.

Figure 8:
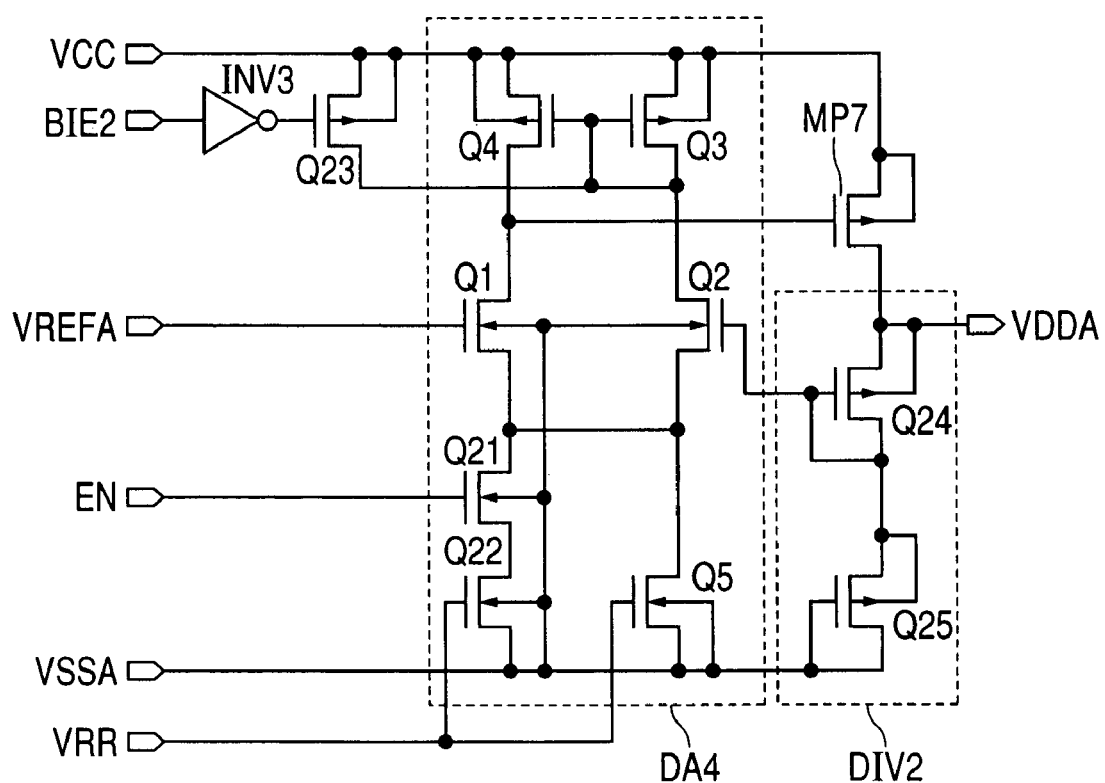
FIG. 8 is a circuit diagram illustrating an embodiment of the step-down circuit 20 in FIG. 2.

FIG. 8 is a circuit diagram of an embodiment of the step-down circuit 20 in FIG. 2. Alphabetic code VREFA denotes reference voltage. Alphanumeric code DA4 denotes a differential amplifier, which comprises: the same differential MOSFETs Q1 and Q2 as mentioned above; a current source MOSFET Q5; active load MOSFETs Q3 and Q4 configured in current mirror circuit; and MOSFETs Q21 and Q22. Alphabetic code EN denotes an enable signal, and its signal amplitude is set to between VCC and VSSA. When the signal EN is at high level, the MOSFET Q21 is turned on. As a result, a current formed at the MOSFET Q22 is added to a steady-state current formed at the MOSFET Q5 in correspondence with constant voltage VRR, and the current passed through the differential amplifier DA4 is increased and accelerated.

Alphanumeric code BIE2 denotes a burn-in enable signal, and its signal amplitude is set to between VCC and VSSA. When the signal BIE2 is brought to high level, the output signal of an inverter circuit INV3 is brought to low level. As a result, a p-channel MOSFET Q23 is turned on, and the operation of the differential amplifier DA4 is stopped. Alphanumeric code DIV2 denotes a voltage divider circuit. The voltage divider circuit DIV2 divides the output voltage VDDA through MOSFETs Q24 and Q25 to form a divided voltage equivalent to VDDA2. The voltage divider circuit DIV2 feeds it back to the gate of the differential MOSFET Q2 to form the output voltage VDDA twice the reference voltage VREFA. Alphanumeric code MP7 denotes a p-channel output MOSFET, and the voltage divider circuit DIV2 constitutes a load circuit.

Figure 9:
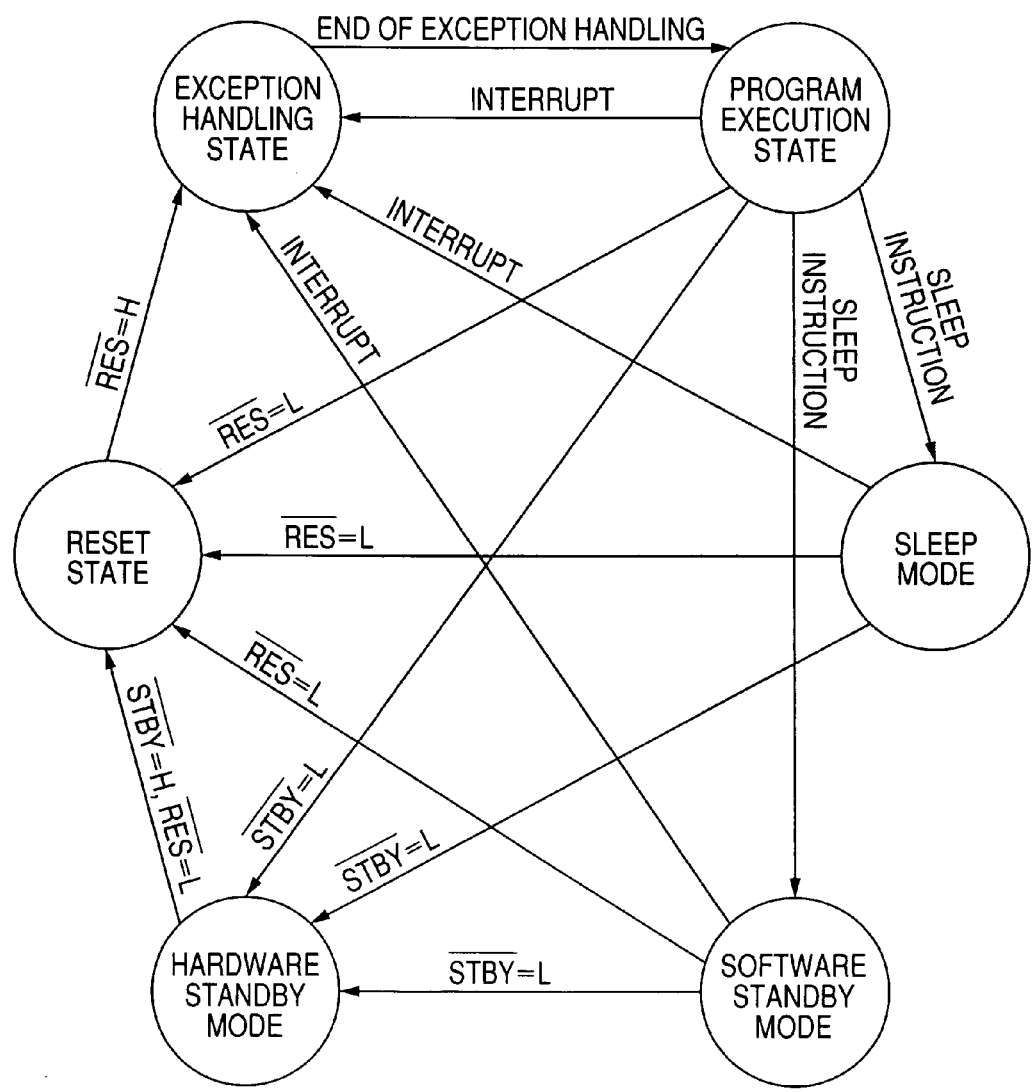
FIG. 9 is a state transition diagram illustrating an embodiment of the one-chip microcomputer in FIG. 1.

FIG. 9 is a state transition diagram of an embodiment of the one-chip microcomputer illustrated in FIG. 1. Program execution state is a state in which CPU is executing a program. In program execution state, the consumption current is increased. When the CPU executes a sleep instruction, the state transitions to sleep mode. In sleep mode, the consumption current is reduced. When the CPU executes a sleep instruction, the state transitions to software standby mode. (Transition to software standby mode is discriminated from transition to sleep mode by the value of a specific register.) In software standby mode, the consumption current is further reduced than in sleep mode. When an external signal /STBY is brought to low level, the state transitions to hardware standby mode. In hardware standby mode, the consumption current is equal to or lower than that in software standby mode. When an external signal /RES is brought to low level, the state transitions to reset state. In reset state, internal circuits are reset.

When an interrupt occurs in program execution state, sleep mode, or software standby mode (when IRQ in FIG. 1 is brought to high level), the state transitions to exception handling state. Also, when /RES is brought to high level in reset state (when reset is canceled), the state transitions to exception handling state. The CPU executes an exception handling program. When exception handling is completed and the CPU executes an RTE (Return from Exception) instruction, the state returns to program execution state.

FIG. 10 is a drawing illustrating the operating state of the step-down circuits corresponding to the operating state of the microcomputer illustrated in FIG. 1. In program execution state, reset state, and exception handling state, all the following circuits are operated: the reference voltage generation circuit 10, step-down circuits for analog circuit 20 and 21, and step-down circuits for digital circuit 30, 31, and 32. In sleep mode, one 32 of the step-down circuits for digital is stopped. In software standby mode and hardware standby mode, the step-down circuit 21 of the step-down circuits for analog and the step-down circuits 31 and 32 of the step-down circuits for digital are stopped. The reference voltage generation circuit and the step-down circuits 20 and 30 are constantly operated.

In each operating state, the step-down circuits 20, 21, and 30 to 33 are operated or stopped according to the magnitude of the consumption current of the internal circuits. As a result, the consumption current of the whole of the step-down circuits can be reduced. When a step-down circuit is stopped, the current of the differential amplifier and output circuit constituting the step-down circuit is interrupted, as mentioned above. Therefore, the consumption current of the power circuit is significantly reduced.

Figure 11A:
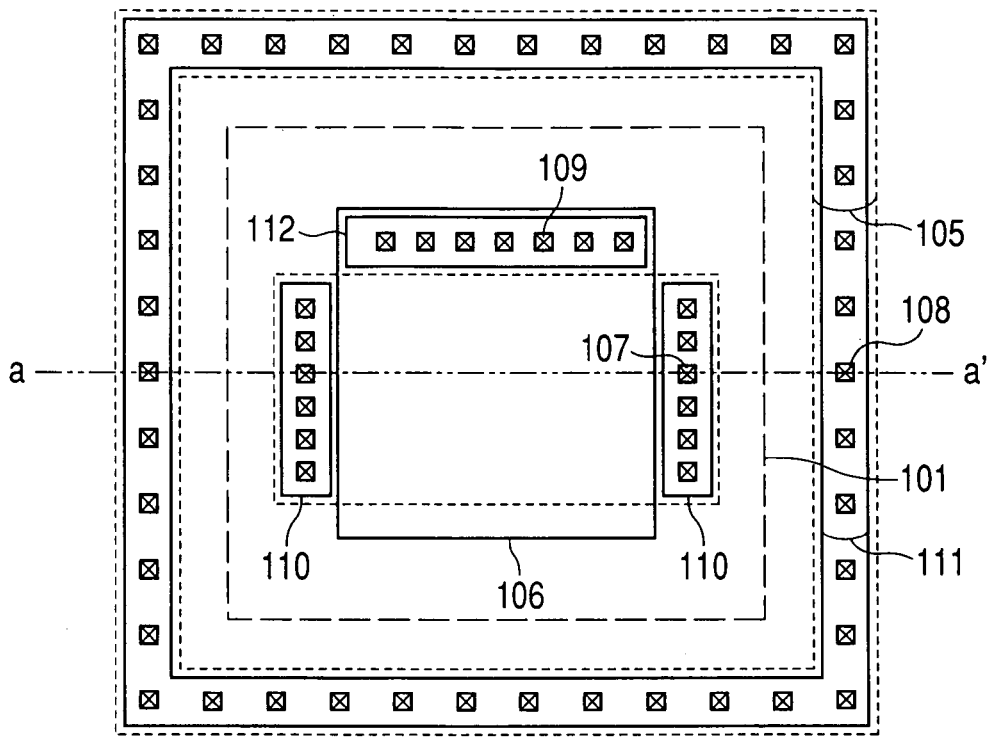
FIGS. 11A and 11B are schematic diagrams illustrating an embodiment of the smoothing capacitance CA in FIG. 1.
Figure 11B:
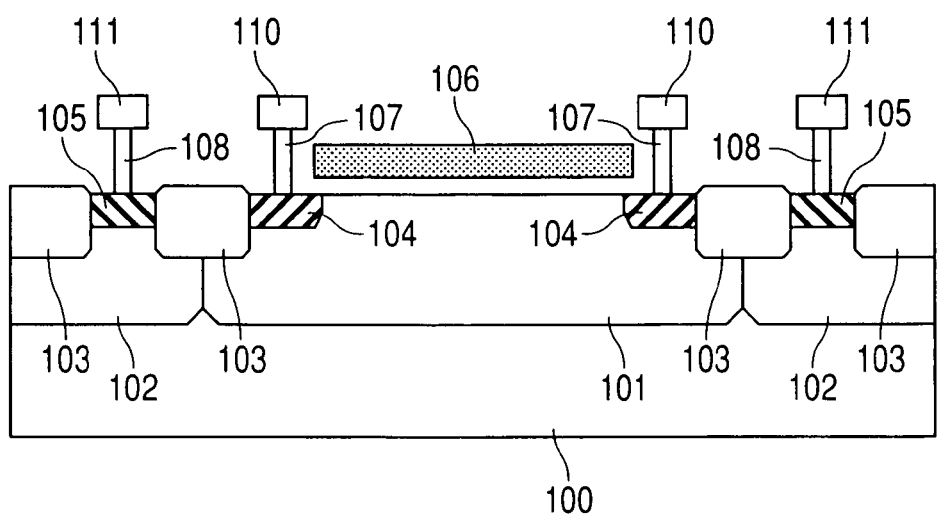

FIGS. 11A and 11B are schematic diagrams illustrating an embodiment of the smoothing capacitance CA in FIG. 1. FIG. 11A illustrates its planar constitution, and FIG. 11B illustrates the sectional constitution taken along the line a-a' of FIG. 11A. Numeral 100 denotes a p-type semiconductor substrate; 101 denotes an n-well; and 102 denotes a p-well. Numeral 103 denotes an insulating film for element isolation; 104 denotes an $n^+$-diffusion layer constituting one electrode of the smoothing capacitance CA; and 105 denotes a $p^+$-diffusion layer, which is used to apply bias voltage to the p-well 102. Numeral 106 denotes polycrystalline silicon, which constitutes the other electrode of the smoothing capacitance CA. Numeral 107 denotes a contact hole on the $n^+$-diffusion layer, and 108 denotes a contact hole on the $p^+$-diffusion layer. Numeral 109 denotes a contact hole on the polycrystalline silicon. Numerals 110, 111, and 112 respectively denote a metal wiring layer.

Of the metal wiring layers, the metal wiring layers 110 are one electrode of the smoothing capacitance CA, and the metal wiring layer 112 is the other electrode. The left and right metal wiring layers 110 are connected with each other through an upper wiring layer though it is not shown in the figure. The metal wiring layer 111 is wiring for grounding the substrate. The smoothing capacitance CA in this embodiment is characterized in that it is a capacitor relatively less dependent on voltage as compared with MOS capacitors. Therefore, the smoothing capacitance CA can also be used as the phase compensation capacitance CC in FIG. 6.

Figure 12:
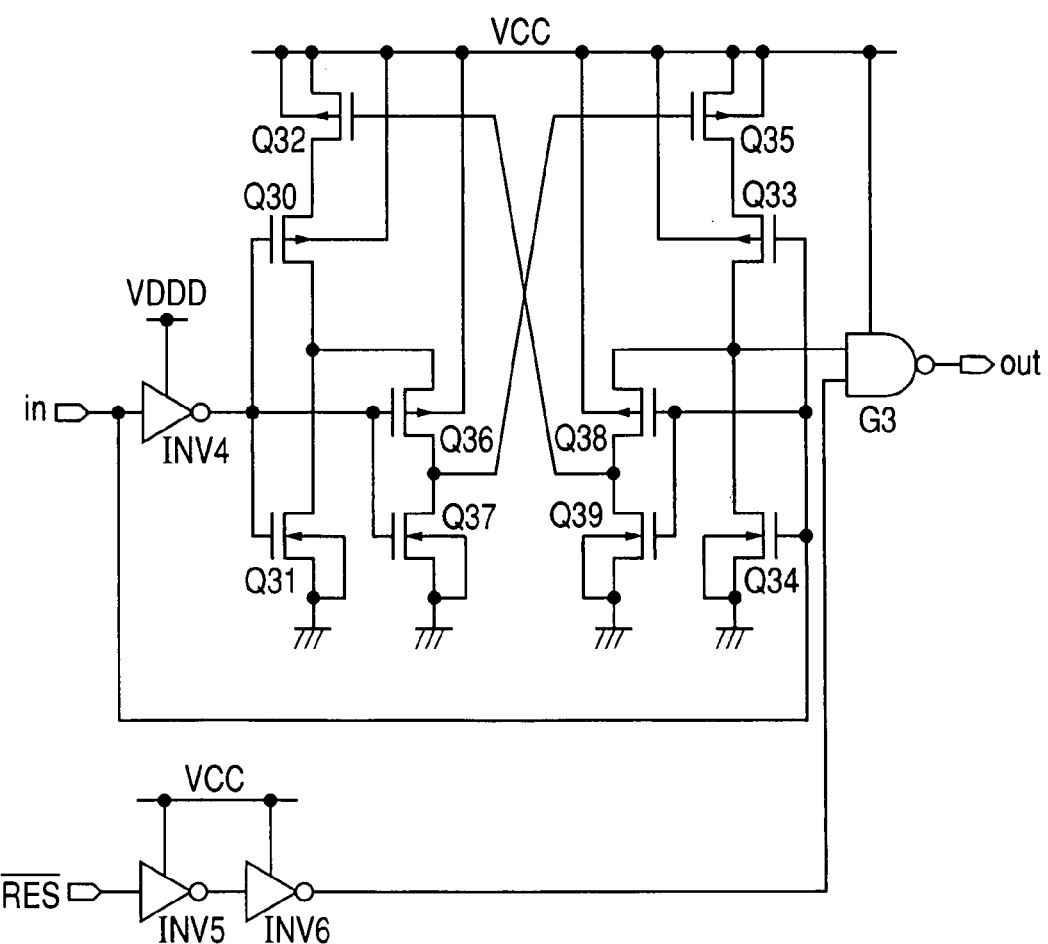
FIG. 12 is a circuit diagram illustrating an embodiment of a level-up conversion circuit used in the present invention.

FIG. 12 is a circuit diagram illustrating an embodiment of a level-up conversion circuit used in the present invention. This level-up conversion circuit is used as the level-up conversion circuit 70 in FIG. 1 and the level-up conversion circuits 14 and 15 in FIG. 4. The level-up conversion circuit LCU in this embodiment converts input signals in at the VDDD level into output signals out at the VCC level. More specific description will be given. An input signal in at the VDDD level is supplied to the gates of n-channel MOSFETs Q34 and Q39 and p-channel MOSFETs Q33 and Q38. The inversion signal of the input signal in formed at an inverter circuit INV4 at the VDDD level is supplied to the gates of n-channel MOSFETs Q31 and Q37 and p-channel MOSFETs Q30 and Q36. A CMOS inverter circuit comprising the MOSFETs Q30 and Q31 is supplied with supply voltage VCC through a p-channel MOSFET Q32. Similarly, a CMOS inverter circuit comprising the MOSFETs Q33 and Q34 is supplied with supply voltage VCC through a p-channel MOSFET Q35.

A CMOS inverter circuit comprising the MOSFETs Q36 and Q37 is supplied as operating voltage with the output voltage of the CMOS inverter circuit comprising the MOSFETs Q30 and Q31. A CMOS inverter circuit comprising the MOSFETs Q38 and Q39 is supplied as operating voltage with the output voltage of the CMOS inverter circuit comprising the MOSFETs Q33 and Q34. The output signal of the CMOS inverter circuit comprising the MOSFETs Q36 and Q37 and the output signal of the CMOS inverter circuit comprising the MOSFETs Q38 and Q39 are crosswise transmitted to the gates of the p-channel MOSFETs Q35 and Q32. A reset signal /RES is inputted to a gate circuit G3, and the output signal out is formed through the gate circuit G3. The gate circuit G3 and inverter circuits INV5 and INV6 are operated on supply voltage VCC. Provision of such an output control circuit fixes the output out at high level when the reset signal /RES is at low level. When the microcomputer is in reset state, as illustrated in FIG. 9, the control signals can be fixed in default state.

Figure 13:
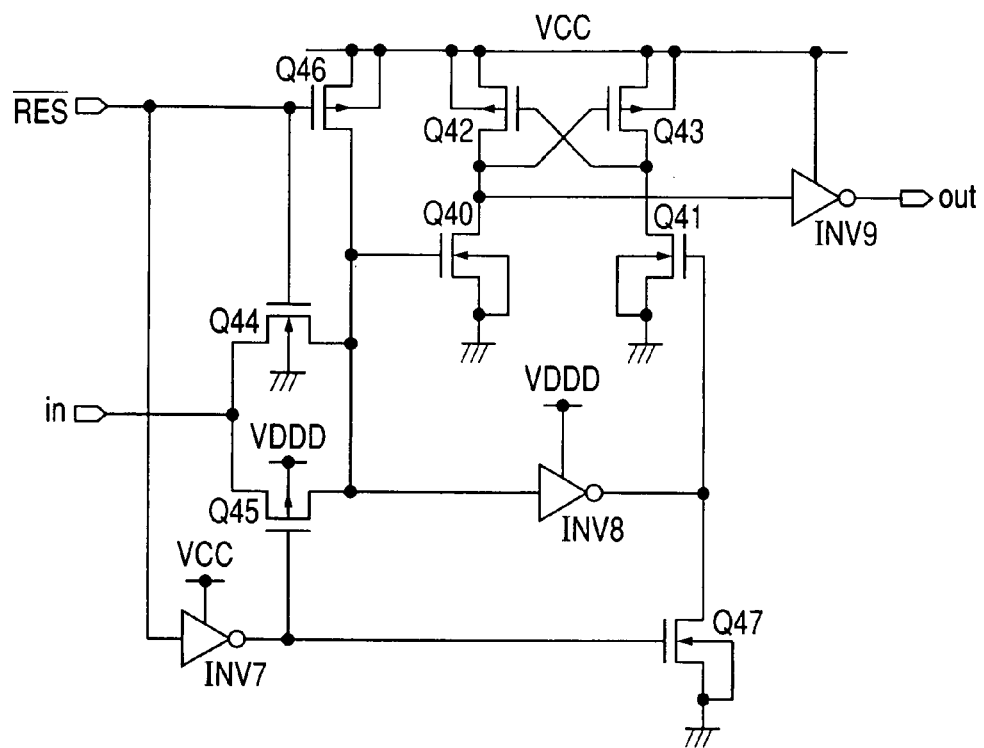
FIG. 13 is a circuit diagram illustrating another embodiment of the level-up conversion circuit used in the present invention.

FIG. 13 is a circuit diagram illustrating another embodiment of the level-up conversion circuit used in the present invention. An input signal in is supplied to the gate of an n-channel MOSFET Q40 through a CMOS switch comprising an n-channel MOSFET Q44 and p-channel MOSFET Q45 controlled according to the reset signal /RES. The input signal in passed through the CMOS switch (Q44 and Q45) is inverted by an inverter circuit INV8 and supplied to the gate of an n-channel MOSFET Q41. P-channel MOSFETs Q42 and Q43 whose gates and drains are cross-connected are provided between the drains of the n-channel MOSFETs Q40 and Q41 and supply voltage VCC. The reset signal /RES is supplied to the gate of a p-channel MOSFET Q46 provided between the gate of the n-channel MOSFET Q40 and supply voltage VCC, and inverted by an inverter circuit INV7. The thus inverted reset signal is supplied to the gate of an n-channel MOSFET Q47 provided between the gate of the n-channel MOSFET Q41 and ground potential. The drain output of the MOSFET Q40 is outputted as the output signal out through an inverter circuit INV9. In this embodiment as well, when the reset signal /RES is at low level, the input of the input signal in to the level conversion portion is interrupted. At the same time, the n-channel MOSFET Q40 is forcedly turned on, and the MOSFET Q41 is forcedly turned off. Thus, the output signal out passed through the inverter circuit INV9 is fixed at high level.

Figure 14:
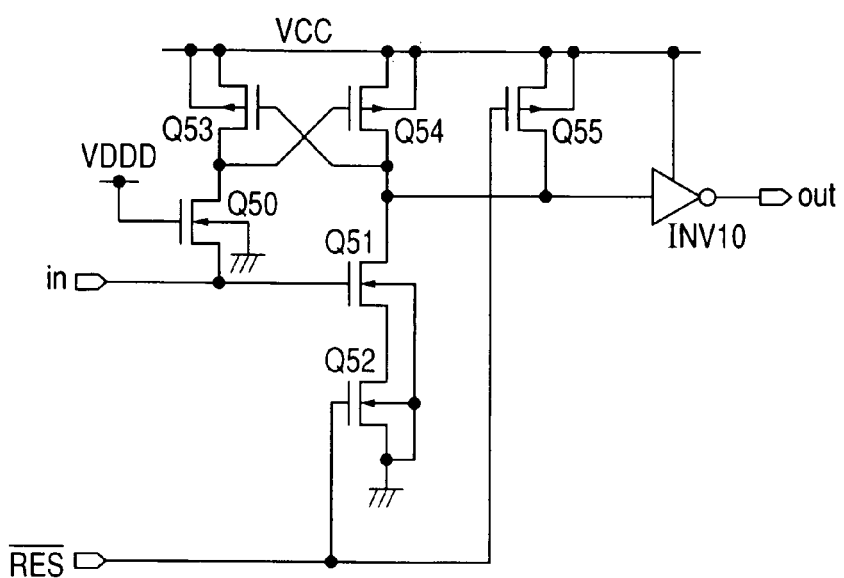
FIG. 14 is a circuit diagram illustrating a further embodiment of the level-up conversion circuit used in the present invention.

FIG. 14 is a circuit diagram illustrating a further embodiment of the level-up conversion circuit used in the present invention. An input signal in is supplied to the source of an n-channel MOSFET Q50 that is supplied at its gate with the low level-side supply voltage VDDD and the gate of an n-channel MOSFET Q51. P-channel MOSFETs Q53 and Q54 whose gates and drains are cross-connected are provided between the drains of the MOSFETs Q50 and Q51 and supply voltage VCC. An n-channel MOSFET Q52 that receives a reset signal /RES is provided between the source of the n-channel MOSFET Q51 and ground potential of the circuitry. A p-channel MOSFET Q55 that is supplied at its gate with the reset signal /RES is provided between the drain of the MOSFET Q51 and supply voltage VCC. The output signal obtained from the drain of the MOSFET Q51 is outputted as the output signal out through an inverter circuit INV10. In this embodiment as well, when the reset signal /RES is at low level, the MOSFET Q52 is turned off to stop level conversion operation. At the same time, the MOSFET Q55 is turned on to fix the output signal out passed through the inverter circuit INV10 at low level.

Figure 15:
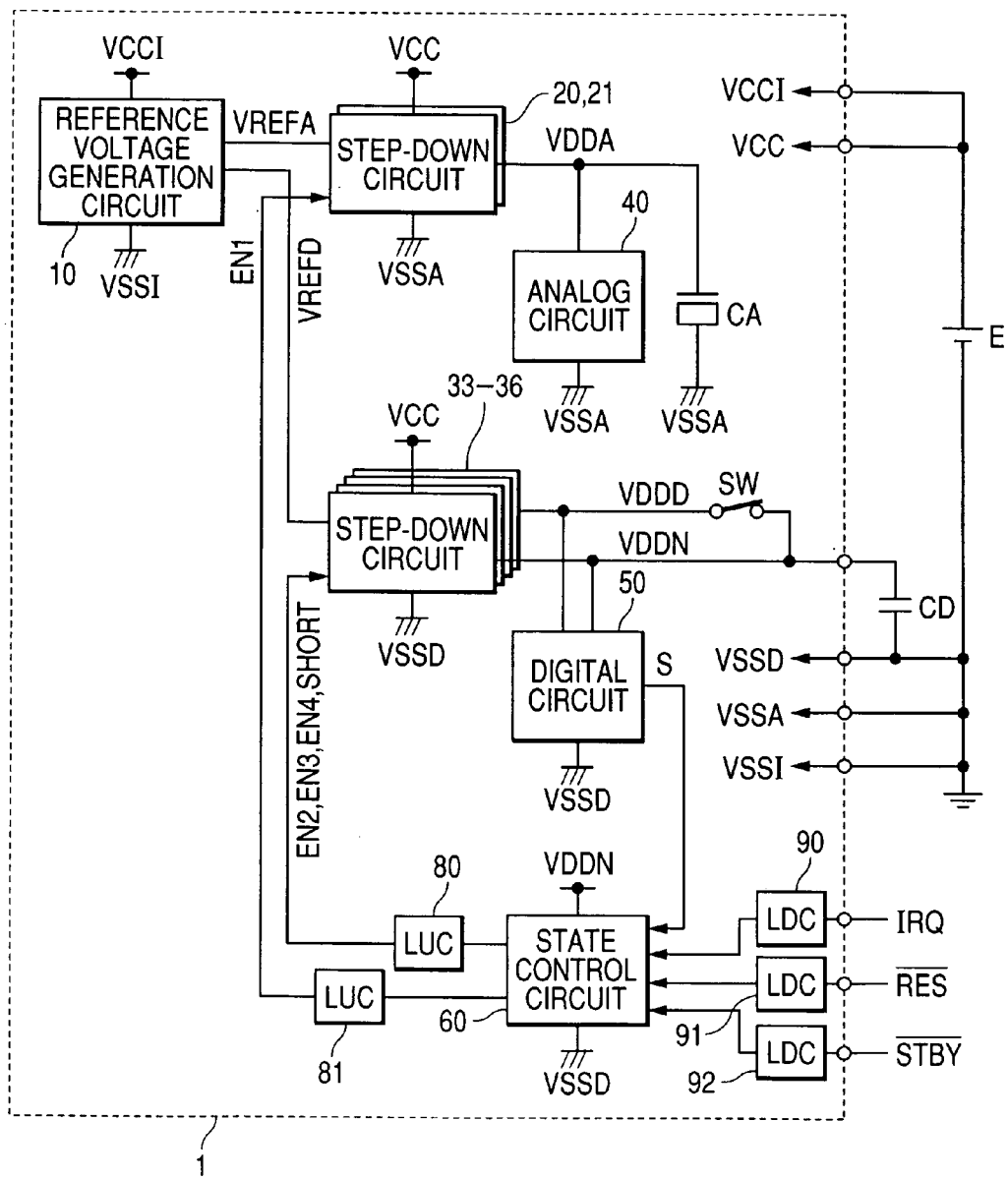
FIG. 15 is a block diagram illustrating another embodiment of a semiconductor integrated circuit device according to the present invention.

FIG. 15 is a block diagram illustrating another embodiment of the semiconductor integrated circuit device according to the present invention. The semiconductor integrated circuit device in this figure is directed to one-chip microcomputers or system LSIs including CPU. This embodiment is different from the embodiment in FIG. 1 in that: in standby mode (software standby and hardware standby), part of internal power supply for digital circuit is turned off. Alphabetic code VDDN denotes internal voltage for digital circuit. Numerals 33 to 36 denote step-down circuits for digital circuit, and generate power supplies VDDD and VDDN for a digital circuit 50. The VDDD and the VDDN are identical with each other in voltage value, which is set to a low voltage, for example, 1.5V. The supply voltage for the step-down circuits 33 to 35 is VCC and VSSD. In the step-down circuit 33 to 35 in this embodiment, the internal voltage VDDD is zeroed in standby mode. Meanwhile, the internal voltage VDDN is held even in standby mode.

Numeral 50 denotes a digital circuit, which comprises RAM (Random Access Memory), ROM (Read Only Memory), register, logic circuit, and the like, as described next. The digital circuit 50 is supplied with VDDD and VSSD or VDDN and VSSD depending on its function. Numeral 60 denotes a state control circuit. Unlike the embodiment in FIG. 1, VDDN and VSSD are used for power supply. Therefore, the state control circuit 60 can be constituted of miniscule devices low in breakdown voltage.

Numerals 80 and 81 denote level-up conversion circuits, and can be implemented by the circuitry illustrated in FIG. 12 to FIG. 14. The level-up conversion circuits 80 and 81 convert enable signals EN1 to EN4 for step-down circuits and an output short circuit signal SHORT from the VDDN level to the VCC level. Numerals 90 to 92 denote level-down conversion circuits, which convert input signals IRQ, /RES, and /STBY from the VCC level to the VDDN level, and supply them to the state control circuit 60. Alphabetic code SW denotes a switch, which is kept off in standby mode and on in other states. Provision of this switch SW makes it possible to use a smoothing capacitance CD both for VDDD and for VDDN.

In this embodiment, the following is implemented: (1) two systems of step-down power supplies for digital circuit, VDDD and VDDN, are provided. VDDD is turned off in correspondence with the operating state, and the leakage current of circuits that use VDDD as power supply is thereby prevented from flowing. That is, not only the power consumption of the step-down circuits themselves but also the power consumption equivalent to the leakage current can be reduced. When input signals do not change, theoretically, the consumption current is not passed through a CMOS circuit. However, a problem arises when MOSFETs are microminiaturized and threshold voltages are lowered. Leakage currents (subthreshold leakage currents and the like) flowing between source and drain and gate leakage currents become considerable. In this embodiment, the power consumption in the digital circuit can also be reduced. (2) The state control circuit 60 is caused to operate on internal power supply VDDN that is kept on. Thus, even in standby mode, interrupt request signals IRQ, reset signals /RES, and standby signals /STBY from outside can be coped with.

Figure 16:
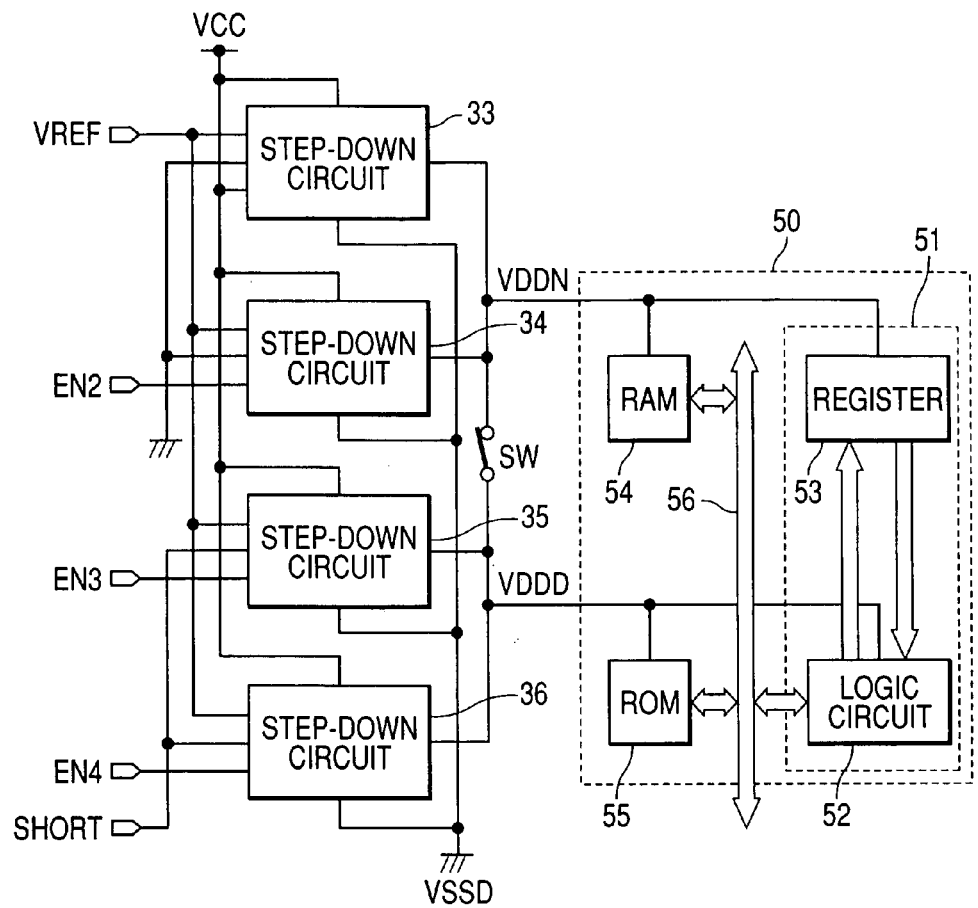
FIG. 16 is a block diagram illustrating an embodiment of the step-down circuits for digital circuit 33 to 36 and the digital circuit 50 in FIG. 15.

FIG. 16 is a block diagram illustrating an embodiment of the step-down circuits for digital circuit 33 to 36 and the digital circuit 50 in FIG. 15. Numeral 33 denotes a VDDN step-down circuit for standby, and its current supply capability is set low and its power consumption is also reduced. Specifically, the step-down circuit 33 is constructed using, for example, the circuitry illustrated in FIG. 7. However, the enable signal EN is connected with supply voltage VCC, and is normally operated when used. Therefore, the output short circuit signal SHORT and the circuitry related thereto can be omitted. Numeral 34 denotes a VDDN step-down circuit for operation, and its current supply capability is set high and its power consumption is also increased. Specifically, the step-down circuit 34 is constructed using, for example, the circuitry illustrated in FIG. 5. The step-down circuit 34 is activated by the enable signal EN2. The output short circuit signal SHORT is not used (is connected with VSSD). The output terminals of the step-down circuits 33 and 34 are connected with each other, and they form the internal voltage VDDN.

Numeral 35 denotes a VDDD step-down circuit for standby, and its current supply capability is set low and its power consumption is also reduced. Specifically, the step-down circuit 35 is constructed using, for example, the circuitry illustrated in FIG. 7. Unlike the step-down circuit 33, the step-down circuit 35 is activated by the enable signal EN3. VDDD is grounded by the output short circuit signal SHORT. Numeral 36 denotes a VDDD step-down circuit for operation, and its current supply capability is set high and its power consumption is also increased. Specifically, the step-down circuit 36 is constructed using, for example, the circuitry illustrated in FIG. 5. The step-down circuit 36 is activated by the enable signal EN4. VDDD is grounded by the output short circuit signal SHORT. The output terminals of the step-down circuits 35 and 36 are connected with each other, and they form the internal voltage VDDD. The output voltages VDDN and VDDD are selectively connected with each other by a switch SW.

The digital circuit 50 comprises CPU 51, RAM 54, and ROM 55 though there is no special limitation. The CPU includes a logic circuit 52 and a register 53. The logic circuit 52 uses VDDD and VSSD as power supply, and the RAM 54 and the register 53 use VDDN and VSSD as power supply. Thus, the information stored in the RAM 54 and the register 53 is held by VDDN even during standby. A register and RAM that store information that may be lost may be supplied with internal voltage VDDD. However, a register and RAM for storing the operating state of the microcomputer must be supplied with normally supplied internal voltage VDDN, as mentioned above. The ROM 55 and the logic circuit 52 use internal voltages VDDD and VSSD. During standby, power supply is off but the information stored in the ROM 55 is not lost because the ROM 55 is a nonvolatile memory. The logic circuit 52 can be supplied with power only in operating state; therefore, there is not problem with the logic circuit 52 even if power supply is off during standby. Numeral 56 denotes a data bus.

Figure 17:
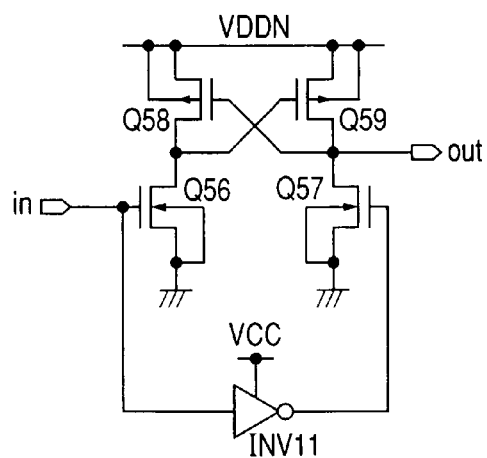
FIG. 17 is a circuit diagram illustrating an embodiment of the level-down conversion circuit in FIG. 15.

FIG. 17 is a circuit diagram illustrating an embodiment of the level-down conversion circuits 90 to 92 in FIG. 15. N-channel MOSFETs Q56 and Q57 receive input signals in and the inversion signal inverted at an inverter circuit INV11. P-channel MOSFETs Q58 and Q59 whose gates and drains are cross-connected are provided between the drains of the n-channel MOSFETs Q56 and Q57 and supply voltage VDDN. Thus, an input signal in at the VCC level is converted into an output signal out at the VDDN level. Instead, an inverter that uses VDDN as power supply may be used; however, in this circuitry, the p-channel MOSFETs can be constituted of miniscule devices low in breakdown voltage.

FIG. 18 is a drawing illustrating the operating state of the step-down circuits corresponding to the operating state of the microcomputer illustrated in FIG. 15. In this embodiment, all the step-down circuits are operated in program execution state, reset state, and exception handling state. In sleep mode, of the step-down circuits for digital, the step-down circuits 34 and 36, large in consumption current, are stopped. In software standby mode and hardware standby mode, the step-down circuit 21 of the step-down circuits for analog and the step-down circuits 34, 35, and 36 of the step-down circuits for digital are stopped. When the step-down circuits 35 and 36 are stopped, VDDD is turned off (interrupted). The reference voltage generation circuit and. the step-down circuits 20 and 33 are normally operated. In each operating state, the step-down circuits are operated or stopped according to the magnitude of the consumption current of the internal circuits.

Further, in standby mode, internal power supply is partly turned off. As a result, the overall consumption current can be reduced.

Figure 19:
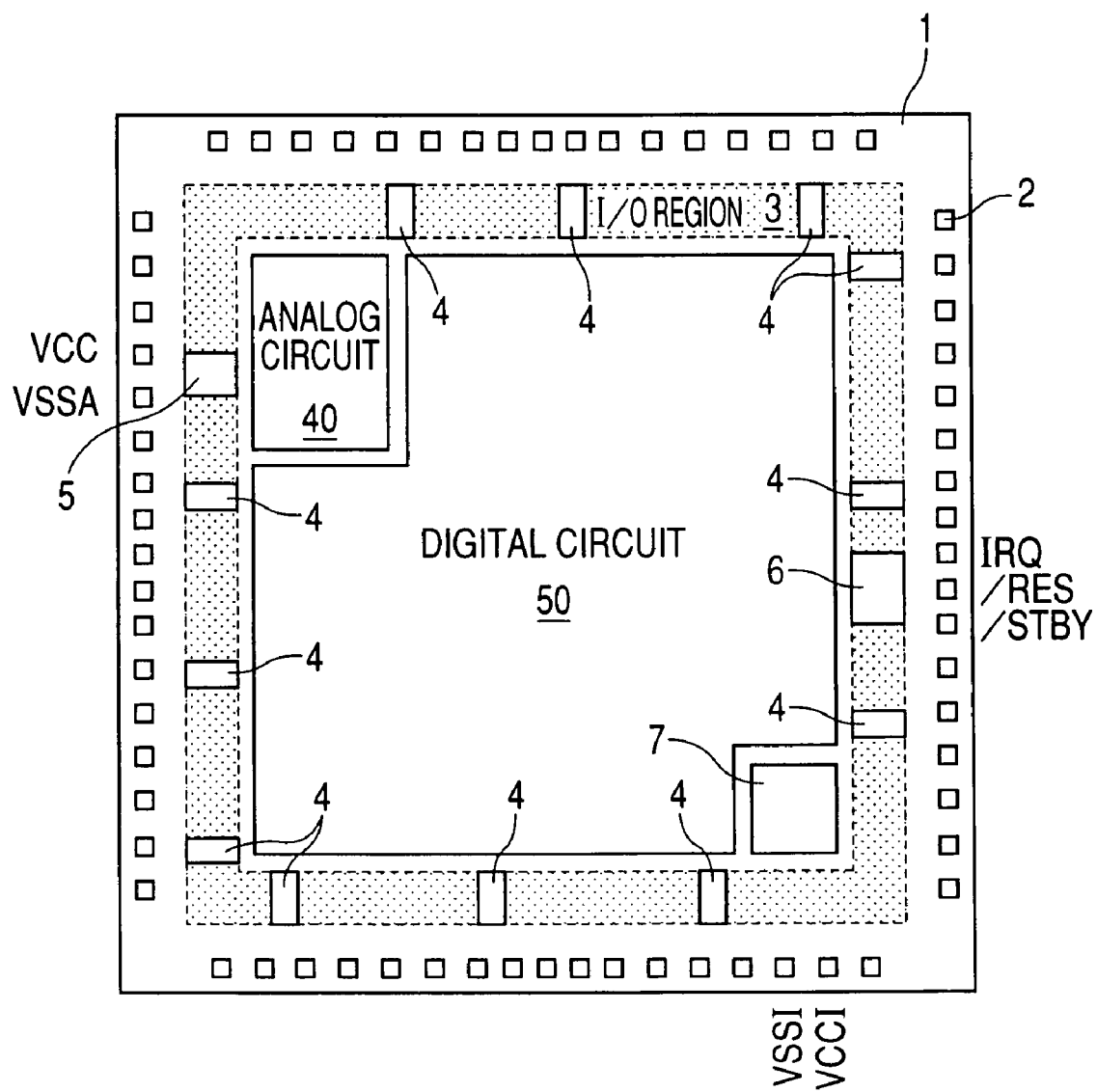
FIG. 19 is a chip layout diagram illustrating an embodiment of the microcomputer in FIG. 15.

FIG. 19 is a chip layout diagram illustrating an embodiment of the microcomputer illustrated in FIG. 15. In the figure, the individual circuit blocks and the like are shown in correspondence with the actual geometric arrangement over a semiconductor chip. Numeral 1 denotes an LSI chip; 2 denotes a bonding pad; and 3 denotes an I/O region where mainly an input/output circuit is displaced. Numeral 4 denotes a region where of step-down circuits for digital circuit, those 34 and 36 large in current supply capability are disposed. These step-down circuits 34 and 36 are dispersedly disposed in the I/O region on the periphery of the chip to supply power to the digital circuit 50 that occupies the major portion of the core region (region inside the I/O region). Thus, the wiring impedance is reduced.

Numeral 5 denotes a region where the step-down circuits for analog circuit 20 and 21 are disposed, and this region is disposed in proximity to the analog circuit 40 and the VCC and VSSA pads. Numeral 6 denotes a region where the level-down conversion circuits 90 to 92 are disposed, and this region is disposed in proximity to the signal IRQ, /RES, and /STBY pads. Numeral 7 denotes a region where the reference voltage generation circuit 10 and the step-down circuits 33 and 35 are disposed. This region is disposed in proximity to the VCCI and VSSI pads for the prevention of noise in power supply used in the reference voltage generation circuit 10. Dedicated power supply terminals VCCQ and VSSQ are provided as appropriate for the input/output circuit, especially for the output circuit, though these terminals are not shown in the figure.

In a semiconductor integrated circuit device such as a microcomputer, a system LSI including CPU, or the like, internal power supply for each circuit block can be turned on/off according to the operation mode. Thus, the consumption current can be reduced in sleep mode and standby mode. With this constitution, the following can be implemented by reduction in power consumption in standby mode and sleep mode, in other words, since the influence of leakage current can be prevented: voltage (threshold voltage) can be further lowered, and the performance can be enhanced. More specific description will be given. When a microcomputer or the like is in low-power consumption mode, such as sleep mode and standby mode, internal power supplies to circuit blocks that do not operate in that mode are turned off. At the same time, the step-down circuits themselves are turned off. Thus, the leakage current can be significantly reduced as a whole. As a result, the threshold voltages of MOSFETs can be reduced more than conventional, and low-voltage and high-speed circuitry can be obtained.

Up to this point, the invention made by the present inventors has been specifically described based on the embodiments. However, the present invention is not limited to these embodiments, and it will be obvious that various changes may be made without departing from the scope of the invention. Some examples will be taken. In the embodiments illustrated in FIG. 1 and FIG. 15, the internal power supply VDDA for analog constantly outputs voltage. Instead, the internal power supply for analog may also be turned off in some operation modes. Thus, the power consumption equivalent to the leakage current of the analog circuit can be further reduced. The step-down circuits and the level conversion circuits can be constructed in various embodiments. The present invention can be widely utilized for semiconductor integrated circuit devices including CPUs (Central Processing Units), microprocessors, and the like.

What is claimed is:

1. A semiconductor integrated circuit device having a first operating mode and a second operating mode comprising:
   an external terminal;
   a first step down circuit to receive a supply voltage through the external terminal, to generate a first internal voltage lower than the supply voltage, and to output the first internal voltage through a first output terminal during the first and second operating modes;
   a second step down circuit to receive the supply voltage through the external terminal, to generate a second internal voltage lower than the supply voltage, and to output the second internal voltage through a second output terminal during the first operating mode, and to bring the second output terminal to a ground level during the second operating mode;
   a first internal circuit to receive the first internal voltage through the first output terminal;
   a second internal circuit to receive the second internal voltage through the second output terminal;
   a state control circuit to bring the semiconductor integrated circuit device into the first operating mode or the second operating mode;
   wherein the operating current of the second step down circuit is interrupted during the second operating mode.

2. The semiconductor integrated circuit device according to claim 1 further comprising:
   a third step down circuit to receive the supply voltage through the external terminal, to generate the first internal voltage, and to output the first internal voltage through a third output terminal during the first operating mode, and to bring the third output terminal into high-impedance state during the second operating mode;
   wherein the first and third output terminals are connected in common.

3. The semiconductor integrated circuit device according to claim 1 further comprising:
   a switch connected between the first output terminal and the second output terminal;
   wherein the first and second internal voltages are substantially equal, and
   wherein the switch is turned on during the first operating mode, and turned off during the second operating mode.

4. The semiconductor integrated circuit device according to claim 1,
   wherein the first internal circuit includes a RAM.

5. The semiconductor integrated circuit device according to claim 1
   wherein the second internal circuit includes a ROM.

6. The semiconductor integrated circuit device according to claim 2 further comprising:
   a fourth step down circuit to receives the supply voltage through the external terminal, to generate the second internal voltage, and to output the second internal voltage through a fourth output terminal during the first operating mode, and to bring the second output terminal to a ground level during the second operating mode;
   wherein the second and fourth output terminals are connected in common.

* * * * *